United States Patent [19]
Koshikawa

[11] Patent Number: 5,708,614
[45] Date of Patent: Jan. 13, 1998

[54] DATA OUTPUT CONTROL CIRCUIT OF SEMICONDUCTOR MEMORY DEVICE HAVING PIPELINE STRUCTURE

[75] Inventor: Yasuji Koshikawa, Tokyo, Japan

[73] Assignee: NEC Corporation, Tokyo, Japan

[21] Appl. No.: 784,783

[22] Filed: Jan. 16, 1997

[30] Foreign Application Priority Data

Jan. 23, 1996 [JP] Japan .................... 8-009121

[51] Int. Cl.[6] .................................................. G11C 29/00
[52] U.S. Cl. ............... 365/201; 365/189.05; 365/189.07
[58] Field of Search ...................... 365/201, 189.05, 365/189.07, 189.12, 194, 233

[56] References Cited

U.S. PATENT DOCUMENTS

| | | | |
|---|---|---|---|
| 5,293,341 | 3/1994 | Tsujimoto | 365/201 |
| 5,400,282 | 3/1995 | Suzuki | 365/201 |
| 5,428,575 | 6/1995 | Fudeyasu | 365/201 |

*Primary Examiner*—David C. Nelms
*Assistant Examiner*—Son Mai
*Attorney, Agent, or Firm*—Sughrue, Mion, Zinn, Macpeak & Seas, PLLC

[57] ABSTRACT

In a method of testing a semiconductor memory device having a pipeline structure, a same data is stored in a plurality of memory cells in advance. The stored data are read out from the plurality of memory cells to produce data signals and amplified as the data signals. A determining section determines whether all the data signals are same, to generate a determination result signal. In accordance with the determination result signal, one of signals associated with the amplified data signals and predetermined signals are transferred to an output section in synchronous with a synchronous signal. The output section includes a plurality of output circuits each of which provides, as an indication signal, one of a low level signal, a high level signal and a signal indicative of a high impedance state in response to each of the transferred signals. Therefore, using at least one of the indication signals, whether the plurality of memory cells are correctly operable can be tested.

20 Claims, 5 Drawing Sheets

DATA OUTPUT CONTROL CIRCUIT OF SEMICONDUCTOR MEMORY DEVICE HAVING PIPELINE STRUCTURE

BACKGROUND OF THE INVENTION

1. Field of the Invention

The present invention relates to a semiconductor memory device having a pipeline structure, and more particularly to a data output control circuit of a semiconductor memory device operable in a parallel test mode.

2. Description of Related Art

Recent years, a semiconductor memory device with a large capacity of memory cells has been developed. The delivery test of such a semiconductor memory device requires a long time. For this reason, the semiconductor memory device is tested in a parallel test mode. In the parallel test mode, the same data are written in a plurality of memory cells in parallel and the written data are read from the plurality of memory cells to determine whether or not the original data coincides with the read data. If both data are coincident with each other, the semiconductor memory device is determined to be operable in a good state. For instance, if memory cells for 4 bits are tested in parallel, the time for the parallel delivery test can be reduced to ¼, compared to a case of that of a sequential delivery test.

Also, a testing apparatus for performing the delivery test is provided with many pins for data input/output and a plurality of semiconductor memory devices can be tested at the same time using the data input/output pins. For instance, a testing apparatus having 32 data input/output pins can test 8 semiconductor memory devices when each of the semiconductor memory devices has a 4-bit input/output structure, if there is no constraint condition. However, in a case where semiconductor memory devices have a 16-bit input/output structure, only two semiconductor memory devices can be tested at the same time. Thus, the efficiency of delivery test is aggravated.

Therefore, a method of effectively performing the delivery test is disclosed in Japanese Laid Open Patent Disclosure (JP-A-Heisei 5-314795) in which a semiconductor memory device having a 16-bit structure is effectively tested in the parallel test mode by apparently handling it as a device having a 4-bit structure.

Figure 1:
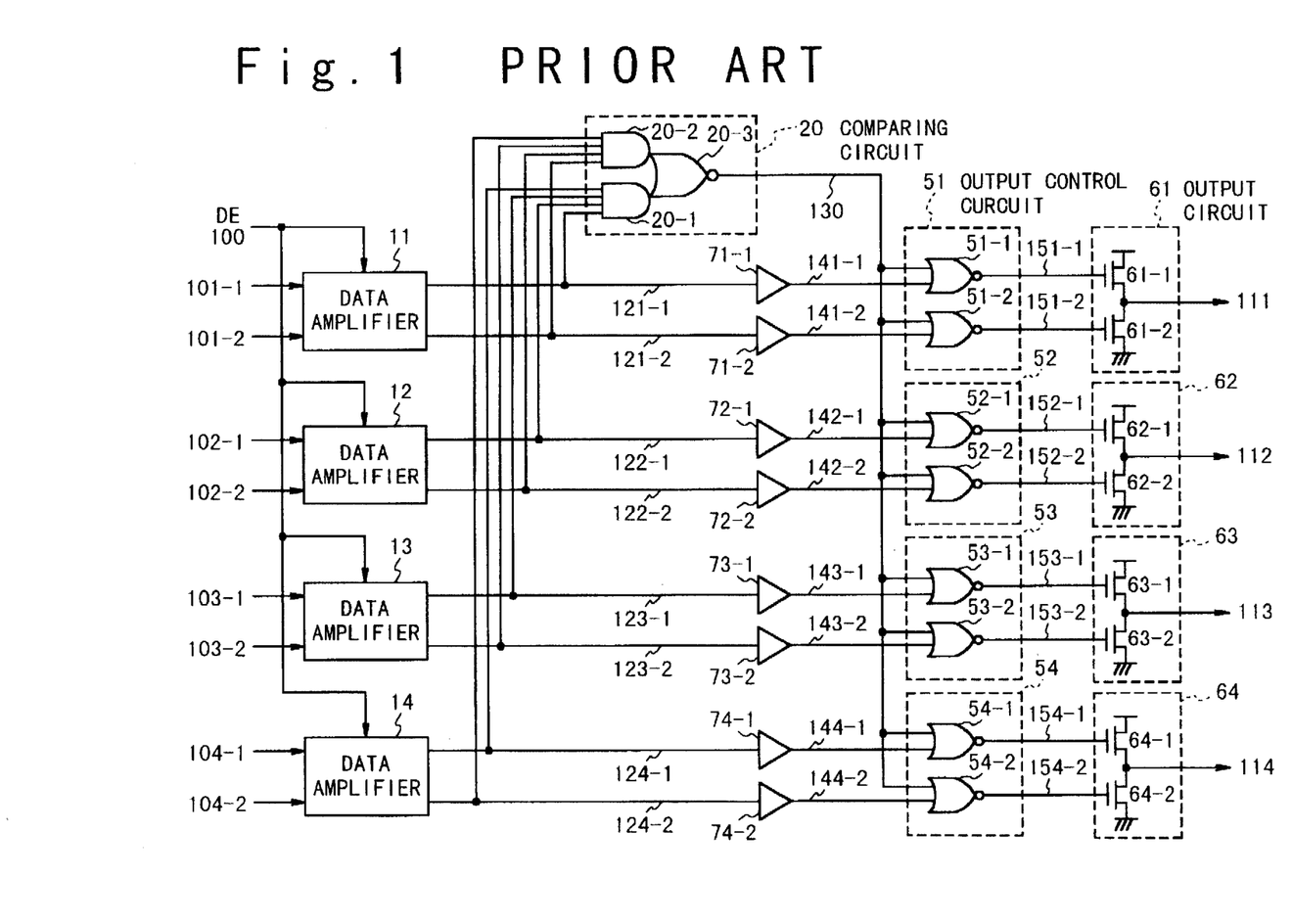
FIG. 1 is a circuit diagram illustrating the structure of a conventional semiconductor memory device.

FIG. 1 is a circuit diagram illustrating an example of a conventional semiconductor memory device which does not have a pipeline structure. Referring to FIG. 1, the semiconductor memory device, a plurality of data amplifiers 11 to 14, a comparing circuit 20 composed of AND gates 20-1 and 20-2 and a NOR gate 20-3, a plurality of buffer 71-1 to 74-2, a plurality of output control circuit 51 to 54 respectively composed of two NOR gates 51-1 and 51-2, 52-1 and 52-2, 53-1 and 53-2, and 54-1 and 54-2, and a plurality of output control circuit 61 to 64 respectively composed of two N-channel MOS transistors 61-1 and 61-2, 62-1 and 62-2, 63-1 and 63-2, and 64-1 and 64-2.

In the semiconductor memory device, a data amplification signal DE100 and data signals 101-1 and 101-2; 102-1 and 102-2; 103-1 and 103-2; and 104-1 and 104-2 having a complementary level relation from a plurality of memory cell elements, 4 memory cell elements in this example are inputted to the data amplifiers 11 to 14. The data amplifiers 11 to 14 amplify the data signals 101-1 to 104-2 in response to the data amplification signal DE100 to produce first data signals 121-1, 122-1, 123-1 and 124-1 and second data signals 121-2, 122-2, 123-2, and 124-2, respectively. The first data signals 121-1, 122-1, 123-1 and 124-1 are supplied to the first AND gate 20-1 of the comparing circuit 20 and the second data signals 121-2, 122-2, 123-2, and 124-2 are supplied to the second AND gate 20-2 thereof. Also, the first and second data signals 121-1 to 124-2 are supplied to the plurality of output control circuit 51 via the plurality of buffers 71-1 to 74-2 as data signals 141-1 to 144-2, respectively. The comparing circuit 20 outputs a comparison resultant signal of an active level (a low level) when the condition is satisfied which all the data signals 121-1, 122-1, 123-1 and 124-1 are the same high level or all the data signals 121-2, 122-2, 123-2, and 124-2 are the same high level. When the above condition is not satisfied, the comparing circuit 20 outputs the comparison resultant signal of an inactive level (a high level). The comparison resultant is supplied to one terminal of each of the NOR gates of the output control its 51 to 54. Therefore, when the comparison resultant signal is in the active level, the first and second signals are inverted by the NOR gates and supplied as signals 151-1 to 154-2 to the gates of the N-channel MOS transistors. As a result, the output circuits output signals 111 to 114 of the high or low level. On the other hand, when the comparison result signal is in the inactive level, all the NOR gates output signals 151-1 to 154-2 of low level. As a result, the output circuits are set in a high impedance state.

That is, when all the first data signals are the same high level or all the second data signals are the same high level, the comparison resultant signal 130 from the comparing circuit 20 always is in the low level. Therefore, the NOR gates 51-1 to 54-2 invert the data signals 141-1 to 144-2 and output to the output circuits. On the other hand, in the data signals, when there is one data signal different from the other data signals, the comparison result signal 130 is set to the high level. Therefore, the data signals are set to the low level and outputted to the output circuits. In this manner, coincidence/incoincidence of data signals can be determined.

In the above-mentioned conventional semiconductor memory device, the pass to determine the coincidence/non-coincidence of data is present in parallel to the data pass from data amplifiers 11 to 14 to output control circuits 51 to 54. Accordingly, in order to make the data pass to have a pipeline structure for speed-up, if latch circuits for outputting data in response to an internal synchronous signal are arranged between the data amplifiers 11 to 14 and the output control circuits 51 to 54 in place of the buffers 71-1 to 74-2, there is a difference in timing between the reaching of data to the output control circuits 51-1 to 54-2 and the reaching of the comparison resultant signal to the output control circuits 51 to 54. As a result, there is a case that the data signal is temporarily outputted when the output circuits are to be set to the high impedance state for the non-coincidence of data, or the output circuit is temporarily set to the high impedance state when the data signals are to be outputted. In this manner, there is the problem in that the latch circuits cannot be optimally arranged in the synchronous-type semiconductor memory device having an internal pipeline structure for speed-up.

For instance, if the data signals between the data amplifiers 11 to 14 and the latch circuits to be newly arranged are compared by the comparing circuit 20 such that the comparison resultant signal is supplied to the output control circuits 51 to 54, the comparison resultant signal is supplied to the output control circuit earlier than the data signals. Also, if the data signals between the latch circuits to be newly arranged and the output control circuits 51 to 54 are compared by the comparing circuit 20 such that the output control circuit earlier than the comparison the comparison resultant signal is supplied to the output control circuits 51 to 54, the data signals are supplied to resultant signal.

Generally, a testing apparatus or a memory tester used for delivery test outputs a high level output when the output signal has a level higher than a preset VOH level and a low level output when the output signal has a level lower than a preset VOL level, and determines a high impedance state when the output signal has a level between the preset VOH level and the preset VOL level. Accordingly, if it is determined to be the high impedance after the high or low level output is temporarily outputted, it is required to delay the determination timing in the test apparatus or the memory tester. As a result, it becomes impossible to test the speed characteristics such as access time of the semiconductor memory device. On the contrary, if the high or low level output is outputted after the high impedance is temporarily determined, the test cannot be always performed correctly, depending upon the output determination timing in the testing apparatus or the memory tester.

A test burn-in apparatus which is often used for the delivery test of the semiconductor memory device in the parallel test mode and which has a good test efficiency because there are many parallel test points does not have two determination levels of VOH and VOL. For this reason, when a signal has a level higher than a preset VO level, it is determined to be a high level output, and when a signal has a level lower than the preset VO level, it is determined to be a low level output. Accordingly, when the high impedance output is outputted, it is determined that the signal is the same as a signal outputted immediately before. In this manner, if the high or low level output is temporarily outputted, the high impedance output cannot be correctly determined.

The technique is disclosed in Japanese Laid Open Patent Disclosure (JP-A-Heisei 3-222200) in which a comparison result is once latched and then read out. In this example, a path in the parallel test mode is different from that in the normal operation mode. Therefore, there is a problem in that it is not possible to test the speed characteristics of the semiconductor memory device. Also, a lot of circuits for latching the comparison result must be prepared so that the chip area increases.

The technique is disclosed in Japanese Laid Open Patent Disclosure (JP-A-Heisei 4-47590) in which a data is one latched and read out in synchronous with a clock signal. In this example, the parallel test is not performed by comparing the read out data. However, the same problem described above will be occur in the arrangement of the latch circuits for the parallel test.

The speeding-up of a semiconductor memory device is requested with the speeding-up of a CPU in recent years. However, the request is not sufficiently satisfied because of physical limit of the fine lithography technique and increase of chip area due to a large capacity of semiconductor memory device. For this reason, a synchronous type semiconductor memory device having an internal pipeline structure is proposed in Japanese Laid Open Patent Disclosures (JP-A-Showa 61-148692, JP-A-Heisei 6-76566).

SUMMARY OF THE INVENTION

The present invention has, as an object, to provide a semiconductor memory device which can be tested in a parallel test mode and a test method for the same.

Another object of the present invention is to provide a semiconductor memory device in which latch circuits are optimally arranged so that it can have a pipeline structure and a test method.

In order to achieve an aspect of the present invention, a semiconductor memory device having a pipeline structure, includes an amplifier section for amplifying data signals from a plurality of data sources such as memory cells in which same data has been stored in advance, a determining section for determining whether all the data signals are same, to generate a determination result signal, a synchronous signal generating section for generating a synchronous signal, a transfer section for selectively transferring one of signals associated with the amplified data signals and predetermined signals in accordance with the determination result signal and in synchronous with the synchronous signal, and an output section including a plurality of output circuits, for providing, for each of the data signals, one of a low level signal, a high level signal and a signal indicative of a high impedance state in response to the transferred signals such that same output signals are outputted from the plurality of output circuits.

The transfer section may include a latching section for latching the amplified data signals in response to the synchronous signal to generate latched signals, and an output control section for selectively transferring one of signals associated with the latched signals and the predetermined signals to the output section in accordance with the determination result signal. In this case, the output control section outputs the signals associated with the latched signals to the output section in accordance with the determination result signal when it is determined by the determining section that all the data signals are same and the output section outputs one of the high level signals and the low level signals based on the signals associated with the latched signals. Also, the output control section outputs the predetermined signals to the output section in accordance with the determination result signal when it is determined by the determining section that all the data signals are not same and the output section outputs the signal indicative of the high impedance state.

In the above case, the determining section determines whether all the data signals are same, based on the amplified data signals and the latching section latches the determination result signal in response to the synchronous signal to output the latched determination result signal to the output control section.

Alternatively, the transfer section includes a latching section for latching the amplified data signals in response to the synchronous signal to generate latched signals, a delay section for delaying the latched signals, and an output control section for selectively transferring one of signals associated with the delated signals and the predetermined signals to the output section in accordance with the determination result signal. In this case, the output control section outputs the signals associated with the delayed signals to the output section in accordance with the determination result signal when it is determined by the determining section that all the data signals are same and the output section outputs one of the high level signals and the low level signals based on the latched signals. Also, the output control section outputs the predetermined signals to the output section in accordance with the determination result signal when it is determined by the determining section that all the data signals are not same and the output section outputs the signal indicative of the high impedance state.

In the above case, the determining section determines whether all the data signals are same, based on the latched signals to generate the determination result signal.

In order to achieve another aspect of the present invention, a method of testing a semiconductor memory device having a pipeline structure, comprising the steps of:

storing same data in a plurality of memory cells;

reading out the data from the plurality of memory cells to produce data signals and amplifying the data signals;

determining whether all the data signals are same, to generate a determination result signal;

selectively transferring one of signals associated with the amplified data signals and predetermined signals in accordance with the determination result signal in synchronous with a synchronous signal;

providing, as an indication signal, one of a low level signal, a high level signal and a signal indicative of a high impedance state in response to each of the transferred signals; and judging whether the plurality of memory cells are correctly operable, using at least one of the indication signals.

BRIEF DESCRIPTION OF THE DRAWINGS

FIGS. 3A to 3H-4 are timing charts illustrating the wave forms of various signals in the semiconductor memory device according to the first embodiment;

FIGS. 5A to 5F-4 are timing charts illustrating the wave forms of various signals in the semiconductor memory device according to the second embodiment.

DESCRIPTION OF THE PREFERRED EMBODIMENTS

The semiconductor memory device of the present invention will be described below in detail with reference to the accompanying drawings.

Figure 2:
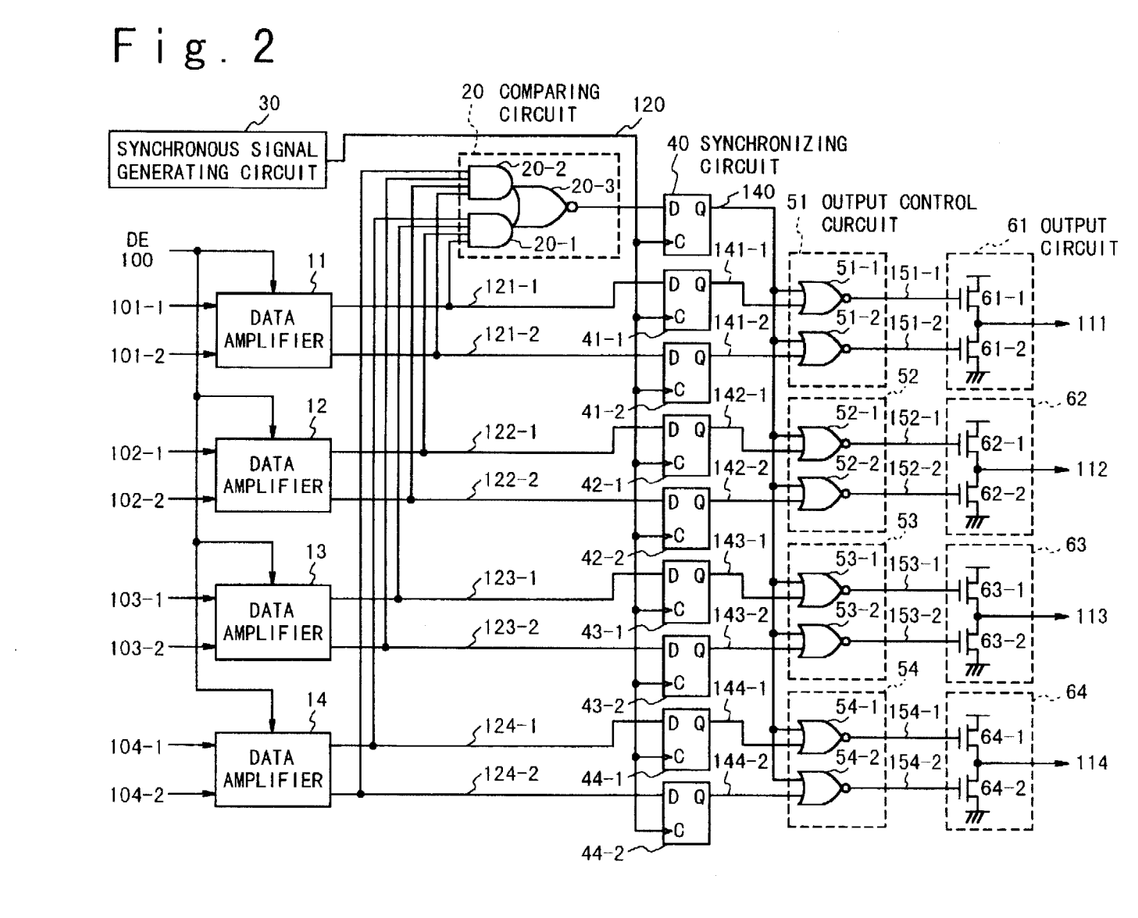
FIG. 2 is a circuit diagram illustrating the structure of a semiconductor memory device according to a first embodiment of the present invention.

FIG. 2 is a circuit diagram illustrating the structure of the semiconductor memory device according to the first embodiment of the present invention. In the semiconductor memory device of the first embodiment shown in FIG. 2, data associated with 4 memory cells are processed. Referring to FIG. 2, the semiconductor memory device is composed of data amplifiers 11 to 14, a synchronous signal generating circuit 30, a comparing circuit 20, synchronizing circuits 40, 41-1, 41-2 . . . 44-2, output control circuits 51 to 54, and output circuits 61 to 64.

More specifically, in the semiconductor memory device, data signals associated with a plurality of memory cells, i.e., data signals associated with 4 memory cells in this embodiment, 101-1, 101-2, 102-1, 102-2, 103-1, 103-2, 104-1, and 104-2 are inputted to the data amplifiers 11 to 14. Also, a data amplification signal DE100 is inputted into the data amplifiers 11 to 14. The data signals 101-1 and 101-2; 102-1 and 102-2; 103-1 and 103-2; 104-1 and 104-2 are complementary signals, respectively. Each of the data amplifiers 11 to 14 amplifies the corresponding complementary data signals in response to the data amplification signal DE100 to have a high level equal to a power supply higher potential and a low level equal to a power supply lower potential, i.e., a ground level. As a result, the amplified data signals 121-1 to 124-2 are obtained.

Each of the synchronizing circuits is composed of a D-type flip-flop circuit. The amplified data signals 121-1 to 124-2 are supplied to data input terminals of the synchronizing circuits 41-1, 41-2 . . . 44-2, respectively. Also, the amplified data signals 121-1 to 124-2 are grouped into two groups. That is, one group is composed of the amplified data signals 121-1, 122-1, 123-1 and 124-1 and the other group is composed of the amplified data signals 121-2, 122-2, 123-2 and 124-2. The two groups of amplified data signals are supplied to the comparing circuit 20.

The comparing circuit 20 is composed of two AND gates 20-1 and 20-2 and a NOR gate 20-3. The AND gate 20-1 receives the one group of amplified data signals 121-1, 122-1, 123-1 and 124-1 and the AND gate 20-2 receives the other group of amplified data signals 121-2, 122-2, 123-2 and 124-2. The outputs of the AND gates 20-1 and 20-2 are supplied supplied as a comparison resultant signal to the data input to the NOR gate 20-3. The output of the NOR gate 20-3 is terminal of the flip-flop circuit 40 as the synchronizing circuit.

That is, when all the amplified data signals 121-1, 122-1, 123-1 and 124-1; or 121-2, 122-2, 123-2 and 124-2 of one of the two groups are the same high level, the comparing circuit 20 outputs the active comparison result signal of a low level. On the other hand, when all the amplified data signals of one of the two Groups are not the same high level, the comparing circuit 20 outputs an inactive comparison result signal of a high level. In this case, because each of the complementary data signal pairs is amplified by the data amplifier, there is no case where two amplified data signals of the pair have the same level.

The synchronous signal generating circuit 30 generates an internal synchronous signal 120 in synchronous with, for example, an external clock signal. The internal synchronous signal 120 is supplied to the clock terminals of the flip-flop circuits 40 to 44-2 as the synchronizing circuits. Therefore, the outputs 140, 141-1 to 144-2 of the flip-flop circuits 40 to 41 are outputted at the same timing. In this manner, there is no delay between the comparison result signal 140 from the flip-flop circuit 40 and the data signals 141-1 to 144-2 from the flip-flop circuits 41-1 to 44-2.

The data signals 141-1 to 144-2 outputted from the flip-flop circuits 41-1 to 44-2 are supplied to the output control circuits 51 to 54, respectively. Also, the comparison result signal 140 is supplied to all the output control circuits 51 to 54. The output control circuits 51 to 54 is composed of two NOR gates 51-1 and 51-2; 52-1 and 52-2; 53-1 and 53-2; and 54-1 and 54-2, respectively. The data signals 141-1 to 144-2 from the flip-flop circuits 41-1 to 44-2 are respectively received by the NOR gates 91-1 to 94-2. The comparison resultant signal 140 from the flip-flop circuit 40 is received by all the NOR gates 91-1 to 94-2. Therefore, when the comparison result signal 140 is in the high level, the outputs 151-1 to 154-2 of all the NOR gates 91-1 to 94-2 necessarily becomes a low level. When the comparison result signal 140 is in the low level, the inverted signals of the data signals supplied to the NOR gates 91-1 to 94-2 are outputted from the NOR gates 91-1 to 94-2.

The output circuits 61 to 64 is composed of two N-channel MOS transistors 61-1 and 61-2; 62-1 and 62-2; 63-1 and 63-2; and 64-1 and 64-2, which are connected between the power supply higher potential and the ground potential in series, respectively. The outputs 151-1 to 154-2 of the NOR gates 91-1 to 94-2 are respectively supplied to the N-channel MOS transistors 61-1 to 64-2. The output circuit 61 is set to a high impedance state, when the data signals 151-1 and 151-2 are in the low level. When the data signal 151-1 is in the high level and the data signal 151-2 is in the low level, the output circuit 61 outputs an output signal 111 of a high level. On the other hand, when the data signal 151-1 is in the low level and the data signal 151-2 is in the high level, the output circuit 61 outputs the output signal 111 of a low level. The other output circuits 62 to 64 also operate in the same manner as the output circuit 61 to output the output signals 112 to 114.

In this manner, if the same data is written in the memory cells and the stored data are read out from the memory cells, the output circuits 61 to 64 output the same signal 111 to 114. Therefore, all the memory cells can be checked only by monitoring one of the output circuits.

Next, the operation of the semiconductor memory device according to the first embodiment of the present invention will be described with reference to FIGS. 3A to 3H-4.

Figure 3:
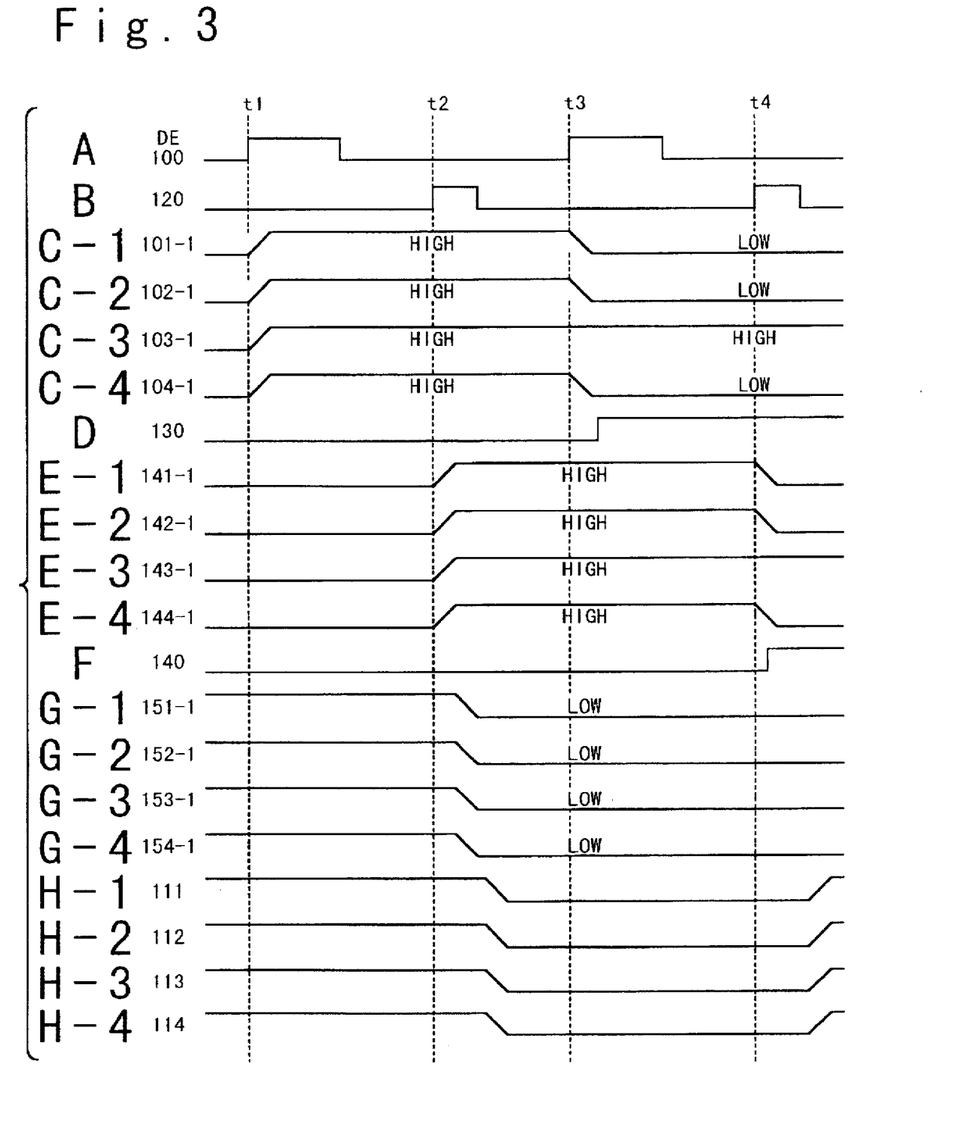

At a time t1, when the data amplification signal DE100 goes to a high level as shown in FIG. 3A, the data signals 101-1 to 104-2 shown in FIGS. 3C-1 to 3C-4 are amplified by the data amplifiers 11 to 14 to produce the signals 121-1 to 124-2. In this case, it is assumed that the amplified data signals 121-1, 122-1, 123-1 and 124-1 are in the high level and the amplified data signals 121-2, 122-2, 123-2 and 124-2 are in the low level. At this time, because all the amplified data signals 121-1, 122-1, 123-1 and 124-1 are in the high level, the comparison resultant signal from the comparing circuit 20 is in the low level.

Next, at a time t2, when the internal synchronous signal 120 goes to a high level as shown in FIG. 3B, all the amplified data signals 121-1 to 124-2 are latched by the flip-flop circuits 41-1 to 44-2, respectively. Also, the comparison resultant signal is latched by the flip-flop circuit 40, as shown in FIG. 3F. The latched data signals 121-1 to 124-2 are outputted as the data signals 141-1 to 144-2 shown in FIGS. 3E-1 to 3E-4 to the NOR gates 51-1 to 54-2 of the output control circuits 51 to 54. In this case, since the comparison resultant signal 140 is in the low level, the inverted data signals 151-1 to 154-2 of the data signals 141-1 to 144-2 are supplied to the output circuits 61 to 64 as shown in FIGS. 3G-1 to 3G-4. Therefore, the output circuits 61 to 64 output the output signals 111 to 114 of the low level as shown in FIGS. 3H-1 to 3H-4.

Next, at a time t3, the data amplification signal DE100 becomes a high level again, as shown in FIG. 3A. It is assumed that the data signals 101-1, 102-1, and 104-1 are in the low level, and the data signal 103-1 is in the high level, as shown in FIGS. 3C-1 to 3C-4. At this time, because the amplified data signals 121-2, 122-2, and 124-2 are in the high level but the amplified data signal 123-2 is in the low level, the comparison resultant signal from the comparing circuit 20 changes to the high level.

Next, at a time t4, when the internal synchronous signal 120 goes to a high level as shown in FIG. 3B, all the amplified data signals 121-1 to 124-2 are latched by the flip-flop circuits 41-1 to 44-2, respectively. Also, the comparison resultant signal is latched by the flip-flop circuit 40, as shown in FIG. 3F. The amplified data signals 121-1 to 124-2 are outputted as the data signals 141-1 to 144-2 to the NOR gates 51-1 to 54-2 of the output control circuits 51 to 54, as shown in FIGS. 3E-1 to 3E-4. In this case, since the comparison resultant signal is in the high level, the output signals 151-1 to 154-2 of the low level are supplied from the NOR gates 51-1 to 54-2 to the output circuits 61 to 64. Therefore, the output circuits 61 to 64 are set to the high impedance states, as shown in FIGS. 3H-1 to 3H-4.

Figure 4:
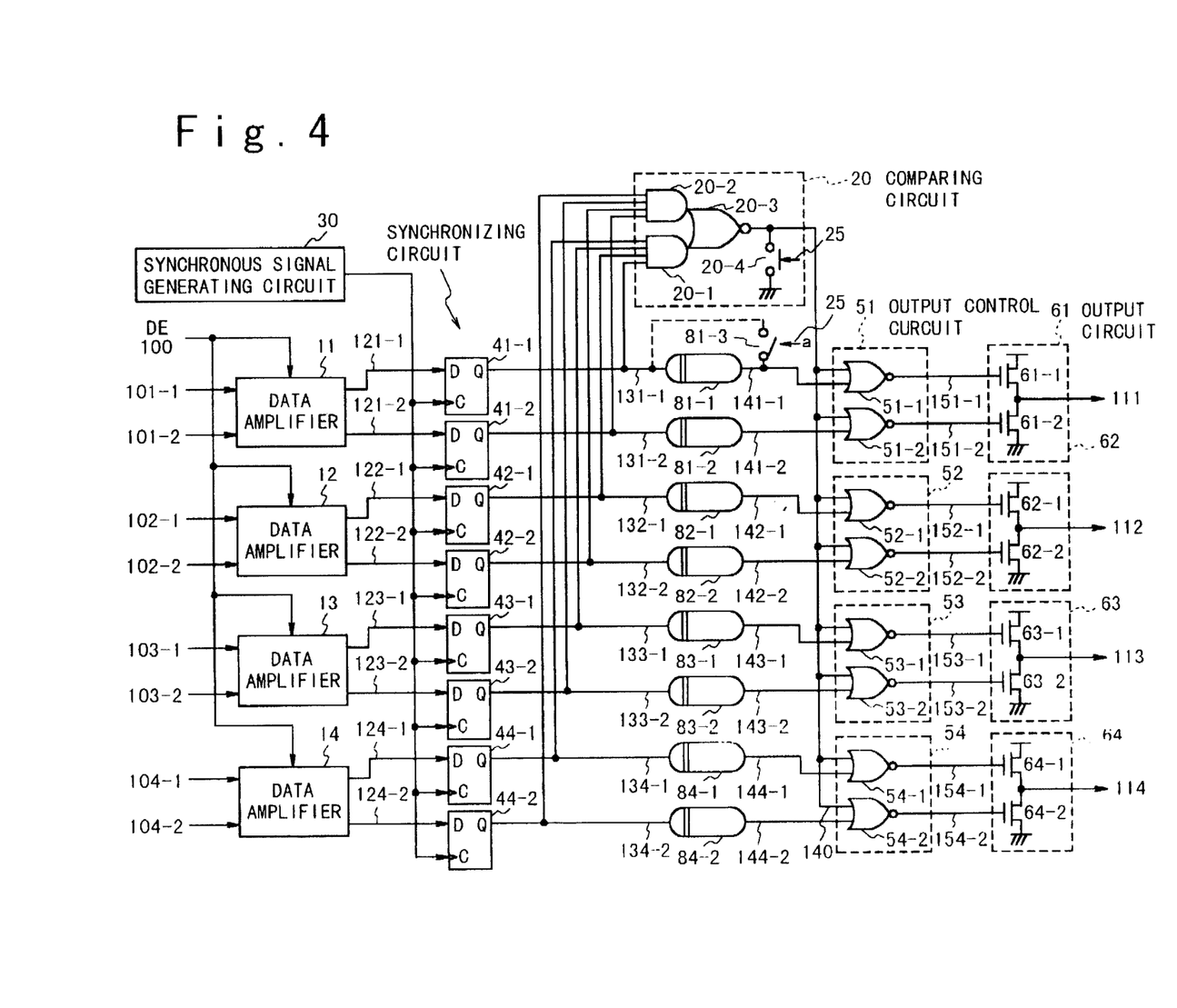
FIG. 4 is a circuit diagram illustrating the structure of a semiconductor memory device according to a second embodiment of the present invention.

FIG. 4 is a circuit diagram illustrating the structure of the semiconductor memory device according to the second embodiment of the present invention, in which the same constituents as those shown in FIG. 2 is denoted by the same reference numerals or symbols to omit the further description thereof. In the semiconductor memory device of the second embodiment shown in FIG. 4.

In this embodiment, the data signals 131-1 to 134-2 outputted from the flip-flop circuits 41-1 to 44-2 are supplied as the data signals 141-1 to 144-2 to the output control circuits 51 to 54 via the delay circuits 81-1 to 84-2, respectively. In this case, each of the delay circuits 81-1 to 84-2 has a predetermined delay time equal to or slightly longer than the operation time of the comparing circuit 20.

Note that the semiconductor memory device may includes a switch 20-4 for forcing the comparison resultant signal 140 connect to the ground level in response to a mode control signal 25 which is activated in the normal operation mode. Thus, the comparing circuit 20 is invalidated in the normal operation mode. Also, a switch 81-3 which is closed in response to the mode control signal 25 may be provided such that the delay circuit does not function in the normal operation mode.

Figure 5:
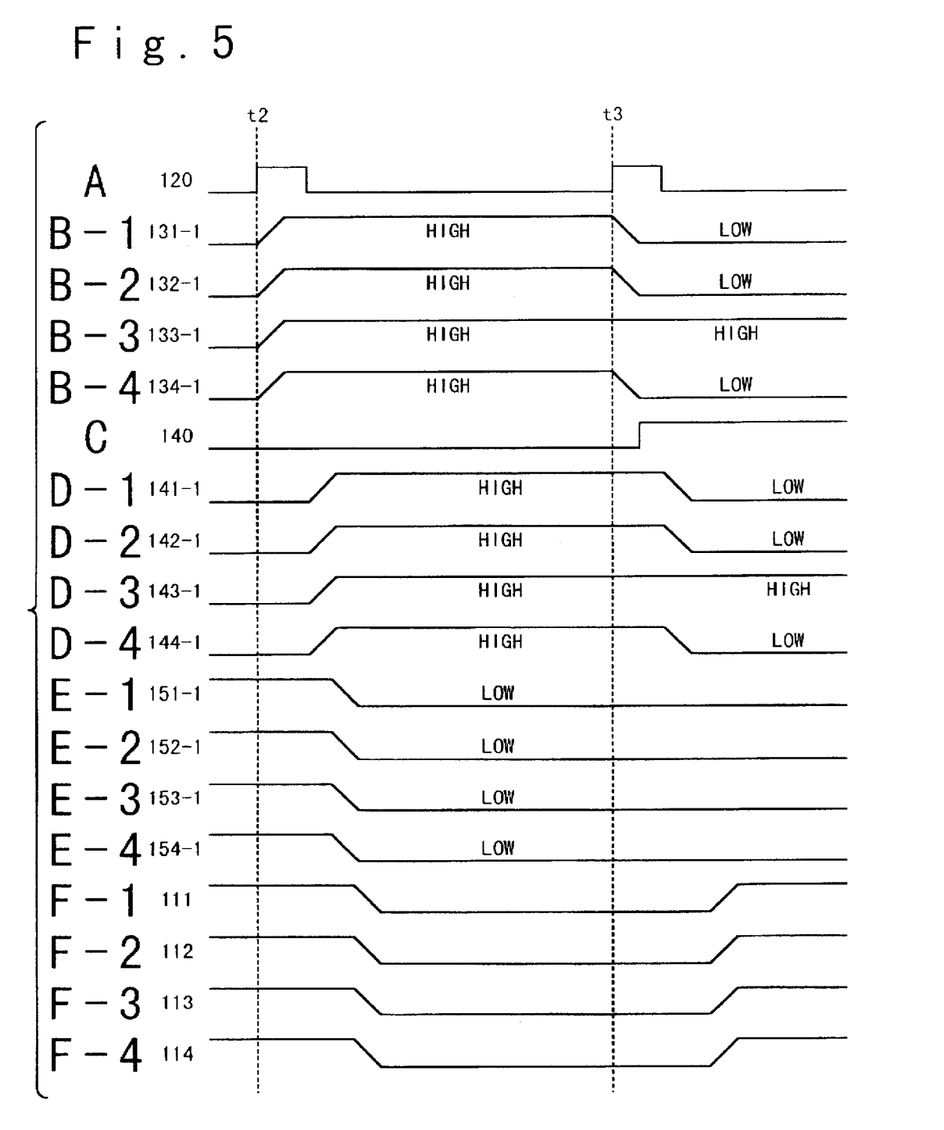

Next, the operation of the semiconductor memory device according to the first embodiment of the present invention will be described with reference to FIGS. 5A to 5F-4.

When the data amplification signal DE100 goes to a high level, the data signals 101-1 to 104-2 are amplified by the data amplifiers 11 to 14 to produce the signals 121-1 to 124-2, as in the first embodiment. In this case, it is assumed that the amplified data signals 121-1, 122-1, 123-1 and 124-1 are in the high level and the amplified data signals 121-2, 122-2, 123-2 and 124-2 are in the low level.

Next, at a time t2, when the internal synchronous signal 120 goes to a high level as shown in FIG. 5A, all the amplified data signals 121-1 to 124-2 are latched by the flip-flop circuits 41-1 to 44-2, respectively. The latched data signals 131-1 to 134-2 are outputted to the delay circuits 81-1 to 84-2, as shown in FIGS. 5B-1 to 5B-4 and then supplied to the NOR gates 91-1 to 94-2 of the output control circuits 51 to 54 with a predetermined delay time as the delayed data signals 141-1 to 144-2, as shown in FIGS. 5D-1 to 5D-4. Also, the latched data signals 131-1 to 134-2 are supplied to the comparing circuit 20. At this time, because all the latched data signals 131-1, 132-1, 133-1 and 134-1 are in the high level, the comparison resultant signal from the comparing circuit 20 is in the low level as shown in FIG. 5C. The comparison resultant signal 140 is supplied to the NOR gates 91-1 to 94-2. In this case, since the comparison resultant signal 140 is in the low level, the inverted data signals 151-1 to 154-2 of the data signals 141-1 to 144-2 are supplied to the output circuits 61 to 64 as shown in FIGS. 5E-1 to 5E-4. Therefore, the output circuits 61 to 64 output the output signals 111 to 114 of the low level as shown in FIGS. 5F-1 to 5F-4.

Next, at a time t3, the data amplification signal DE100 becomes a high level again. It is assumed that the data signals 101-1, 102-1, and 104-1 are in the low level, and the data signal 103-1 is in the high level. Next, when the internal synchronous signal 120 goes to a high level as shown in FIG. 5A, all the amplified data signals 121-1 to 124-2 are latched by the flip-flop circuits 41-1 to 44-2, respectively. The latched data signals 131-1 to 134-2 are outputted to the NOR gates 91-1 to 94-2 of the output control circuits 51 to 54 via the delay circuits 81-1 to 84-2, as shown in FIGS. 5B-1 to 5B-4. Also, the latched data signals shown in FIG. 5C. In this case, since the comparison 131-1 to 134-2 are outputted to the comparing circuit 20 and the comparison resultant signal is generated therein, as resultant signal 140 is in the high level, the output signals 151-1 to 154-2 of the low level are supplied from the NOR gates 91-1 to 94-2 to the output circuits 61 to 64. Therefore, the output circuits 61 to 64 are set to the high impedance states, as shown in FIGS. 5F-1 to 5F-4.

Since the comparison resultant signal 140 is set to the high level at the same time as or earlier than all the data signals 141-1 to 144-2 are transferred, an erroneous output signals is not outputted. In this example, even if the comparison resultant signal 140 reaches the output control circuit 51 to 54 earlier than the data signals 141-1 to 144-2, there is no problem because the difference is smaller than the delay times of the delay circuits 81-1 to 84-2 so that the difference is negligible. If the delay times of the delay circuits 81-1 to 84-2 are known in advance, it is possible to determine the delay time of data output time to the output signals. Therefore, it is possible to perform speed test on, for example, the access time by considering the delay times. If the delay circuits 81-1 to 84-2 are controlled such that they are validated only in the parallel test mode and are invalidated in the normal operation mode, it is possible not to introduce a delay time in the access time in the normal operation mode.

In above description, the comparison resultant signal is supplied to all of the output control circuits 51 to 54. However, because the output signals are same, only one of the output signals is sufficient to test the semiconductor memory device. Therefore, the comparison resultant signal may be supplied only to the output control circuit 51 which is used for the parallel test mode and the other output control circuits may be each composed of a buffer.

As described above, according to the present invention, coincidence/non-coincidence of data is determined at a stage before the output stage on the data path of a pipeline structure. Also, the output signals are controlled in the determining result in response to the internal synchronous signal. As a result, there is no difference between the reaching time of the data signals to the output control circuit and the reaching time of the determining result to the output control circuit. Therefore, when the output of the output circuit must be set to the high impedance state because of the non-coincidence of data, there is no case that the transfer data signal is temporarily outputted. Also, when the data signals must be outputted, there is no case that the output circuit is temporarily set to the high impedance state. In this manner, in the semiconductor memory device having the internal pipeline structure, the latch circuits for outputting data in synchronous with the internal synchronous signal can be optimally arranged.

Also, in the data path of the pipeline structure, the delay circuits are provided such that the reaching of determining result of coincidence/non-coincidence of data to the output control circuits is substantially the same time or slightly earlier than the reaching of the data signals to the output control circuits. Therefore, when the output of the output circuit must be set to the high impedance state because of the non-coincidence of data, there is no case that the transfer data signal is temporarily outputted. Also, when the data signals must be outputted, there is no case that the output circuit is temporarily set to the high impedance state.

In this manner, because the parallel test mode can be used in the synchronous-type semiconductor memory device having the internal pipeline structure, the test time can be reduced to ¼ compared to that of the conventional test method in a case where 4-bit structure memory devices are tested in parallel.

What is claimed is:

1. A semiconductor memory device having a pipeline structure, comprising:

amplifier means for amplifying data signals from a plurality of data sources;

determining means for determining whether all said data signals are same, to generate a determination result signal;

synchronous signal generating means for generating a synchronous signal;

transfer means for selectively transferring one of signals associated with said amplified data signals and predetermined signals in accordance with said determination result signal and in synchronous with said synchronous signal; and output means including a plurality of output circuits, for providing, for each of said data signals, one of a low level signal, a high level signal and a signal indicative of a high impedance state in response to the transferred signals such that same output signals are outputted from said plurality of output circuits.

2. A semiconductor memory device according to claim 1, wherein said transfer means includes:

latching means for latching said amplified data signals in response to said synchronous signal to generate latched signals; and output control means for selectively transferring one of signals associated with said latched signals and said predetermined signals to said output means in accordance with said determination result signal.

3. A semiconductor memory device according to claim 2, wherein said output control means outputs the signals associated with said latched signals to said output means in accordance with said determination result signal when it is determined by said determining means that all said data signals are same and said output means outputs one of said high level signals and said low level signals based on the signals associated with said latched signals.

4. A semiconductor memory device according to claim 2, wherein said output control means outputs said predetermined signals to said output means in accordance with said determination result signal when it is determined by said determining means that all said data signals are not same and said output means outputs the signal indicative of said high impedance state.

5. A semiconductor memory device according to claim 2, wherein said determining means determines whether all said data signals are same, based on said amplified data signals to generate said determination result signal.

6. A semiconductor memory device according to claim 5, wherein said latching means latches said determination result signal in response to said synchronous signal to output the latched determination result signal to said output control means.

7. A semiconductor memory device according to claim 1, wherein said transfer means includes:

latching means for latching said amplified data signals in response to said synchronous signal to generate latched signals;

delay means for delaying said latched signals; and output control means for selectively transferring one of signals associated with said delated signals and said predetermined signals to said output means in accordance with said determination result signal.

8. A semiconductor memory device according to claim 7, wherein said output control means outputs the signals associated with the delayed signals to said output means in accordance with said determination result signal when it is determined by said determining means that all said data signals are same and said output means outputs one of said high level signals and said low level signals based on said latched signals.

9. A semiconductor memory device according to claim 7, wherein said output control means outputs said predetermined signals to said output means in accordance with said determination result signal when it is determined by said determining means that all said data signals are not same and said output means outputs the signal indicative of said high impedance state.

10. A semiconductor memory device according to claim 7, wherein said determining means determines whether all said data signals are same, based on said latched signals to generate said determination result signal.

11. A method of testing a semiconductor memory device having a pipeline structure, comprising the steps of:

storing same data in a plurality of memory cells;

reading out the data from the plurality of memory cells to produce data signals and amplifying the data signals;

determining whether all said data signals are same, to generate a determination result signal;

selectively transferring one of signals associated with said amplified data signals and predetermined signals in accordance with said determination result signal in synchronous with a synchronous signal;

providing, as an indication signal, one of a low level signal, a high level signal and a signal indicative of a high impedance state in response to each of the transferred signals; and judging whether the plurality of memory cells are correctly operable, using at least one of the indication signals.

12. A method according to claim 11, wherein said transferring step includes:

latching said amplified data signals in response to said synchronous signal to generate latched signals; and selectively transferring one of signals associated with said latched signals and said predetermined signals in accordance with said determination result signal.

13. A method according to claim 12, wherein said selectively outputting step includes outputting said latched signals in accordance with said determination result signal when it is determined that all said signals are same, such that one of said high level signals and said low level signals is outputted based on said latched signals.

14. A method according to claim 12, wherein said selectively outputting step includes outputting said predetermined signals in accordance with said determination result signal when it is determined that all said data signals are not same, such that the signal indicative of said high impedance state is outputted.

15. A method according to claim 12, wherein said determining step includes determining whether all said data signals are same, based on said amplified data signals to generate said determination result signal.

16. A method according to 15, wherein said latching step includes latching said determination result signal in response to said synchronous signal.

17. A method according to claim 11, wherein said transferring step includes:

latching said amplified data signals in response to said synchronous signal to generate latched signals;

delaying said latched signals;

selectively transferring one of said latched signals and said predetermined signals in accordance with said determination result signal.

18. A method according to claim 17, wherein said selectively outputting step includes outputting the delayed signals in accordance with said determination result signal when it is determined that all said data signals are same, such that one of said high level signals and said low level signals is outputted based on said latched signals.

19. A data output control circuit comprising:

a plurality of data amplifiers receiving a plurality of data signals;

a comparing circuit determining that all said data signals are same and outputting a determination signal indicating a coincidence or a non-coincidence;

a synchronous signal generator generating a synchronous signal;

a first synchronizing circuit and a plurality of second synchronizing circuits being commonly supplied with said synchronous signal, said first synchronizing circuit transferring said determination signal at timing of generating of said synchronous signal, said plurality of second synchronizing circuits transferring said plurality of data signals at timing of generating of said synchronous signal; and a plurality of output circuits receiving said determination signal from said first synchronizing circuit and said data signals from said second synchronizing circuits and outputting said plurality of data signals in response to said determination signal.

20. A data output control circuit according to claim 19, wherein said plurality of output circuits includes a plurality of output control circuits receiving said determination signal from said first synchronizing circuit and said data signals from said plurality of second synchronizing circuits and outputting a plurality of output signals indicating coincidence when said synchronous signal indicating said coincidence and outputting at least one of said plurality of output signals indicating non-incidence when said synchronous signal indicating said non-coincidence.

* * * * *

UNITED STATES PATENT AND TRADEMARK OFFICE
CERTIFICATE OF CORRECTION

PATENT NO.   : 5,708,614
DATED        : January 13, 1998
INVENTOR(S)  : Yasuji KOSHIKAWA It is certified that error(s) appears in the above-identified patent and that said Letters Patent is hereby corrected as shown below:

Col. 4, line 51 delete "delated" and insert -- delayed --

Col. 7, line 17 delete "3H4" and insert -- 3H-4 --

Col. 10 line 67 delete "delated" and insert -- delayed --

Col. 12, lin 54 delete "non-incidence", and insert -- non-coincidence --

Signed and Sealed this

Fifteenth Day of December, 1998

Attest:

BRUCE LEHMAN

*Attesting Officer*   *Commissioner of Patents and Trademarks*